US009616544B2

(12) United States Patent
Ito et al.

(10) Patent No.: US 9,616,544 B2
(45) Date of Patent: Apr. 11, 2017

(54) WAFER INSPECTION METHOD AND GRINDING AND POLISHING APPARATUS

(71) Applicant: DISCO CORPORATION, Tokyo (JP)

(72) Inventors: Yusaku Ito, Tokyo (JP); Hirohide Yano, Tokyo (JP)

(73) Assignee: Disco Corporation, Tokyo (JP)

( * ) Notice: Subject to any disclaimer, the term of this patent is extended or adjusted under 35 U.S.C. 154(b) by 40 days.

(21) Appl. No.: 14/837,199

(22) Filed: Aug. 27, 2015

(65) Prior Publication Data

US 2016/0059375 A1 Mar. 3, 2016

(30) Foreign Application Priority Data

Aug. 29, 2014 (JP) ................................ 2014-175158

(51) Int. Cl.
*G06K 9/00* (2006.01)
*B24B 37/013* (2012.01)
*H01L 21/66* (2006.01)
*G06T 7/00* (2017.01)
*B24B 49/12* (2006.01)

(52) U.S. Cl.
CPC ............ *B24B 37/013* (2013.01); *B24B 49/12* (2013.01); *G06T 7/0004* (2013.01); *H01L 22/12* (2013.01); *G06T 2207/20056* (2013.01); *G06T 2207/30148* (2013.01); *H01L 22/20* (2013.01)

(58) Field of Classification Search
CPC ....... B24B 37/013; B24B 49/12; H01L 22/12; H01L 22/20; G06T 7/0004; G06T 2207/30148; G06T 2207/20056
USPC ........................ 382/141, 145, 149; 356/237.2
See application file for complete search history.

(56) References Cited

U.S. PATENT DOCUMENTS

| 6,545,764 | B1 * | 4/2003 | Laczik | G01N 21/9501 356/388 |
| 6,894,303 | B2 * | 5/2005 | Livingston | G03B 42/02 250/584 |
| 8,687,197 | B2 * | 4/2014 | Kimba | B24B 37/013 356/445 |
| 2001/0030296 | A1 * | 10/2001 | Ishimaru | G01N 21/474 250/559.4 |
| 2005/0185172 | A1 * | 8/2005 | Ishimaru | G01N 21/474 356/237.2 |
| 2006/0181700 | A1 * | 8/2006 | Andrews | G01N 21/21 356/237.2 |
| 2009/0275264 | A1 * | 11/2009 | Schlicker | B24B 37/013 451/5 |

(Continued)

FOREIGN PATENT DOCUMENTS

JP 2005-153090 6/2005

*Primary Examiner* — Samir Ahmed
(74) *Attorney, Agent, or Firm* — Greer Burns & Crain, Ltd.

(57) ABSTRACT

Disclosed herein is a wafer inspection method of inspecting a wafer after polishing. The wafer inspection method includes the steps of polishing the wafer after grinding, imaging a polished surface of the wafer to thereby create image data including the characteristics of plural saw marks left on the polished surface of the wafer from a detected image, performing Fourier transform to the image data to thereby extract a frequency distribution corresponding to the saw marks, performing inverse Fourier transform to the frequency distribution extracted above to obtain an amplitude of each saw mark, and determining imperfect polishing of the wafer in the case that the amplitude is greater than a predetermined range.

4 Claims, 6 Drawing Sheets

(56) References Cited

U.S. PATENT DOCUMENTS

| | | | |
|---|---|---|---|
| 2010/0006081 A1* | 1/2010 | Choi | B28D 1/041 125/3 |
| 2012/0019830 A1* | 1/2012 | Kimba | B24B 37/013 356/445 |
| 2013/0137244 A1* | 5/2013 | Kramer | H01L 21/02664 438/478 |
| 2013/0163852 A1* | 6/2013 | Ghinovker | G03F 7/70633 382/149 |
| 2014/0057532 A1* | 2/2014 | Long | C09G 1/04 451/41 |
| 2014/0263170 A1* | 9/2014 | Long | C09G 1/02 216/38 |

* cited by examiner

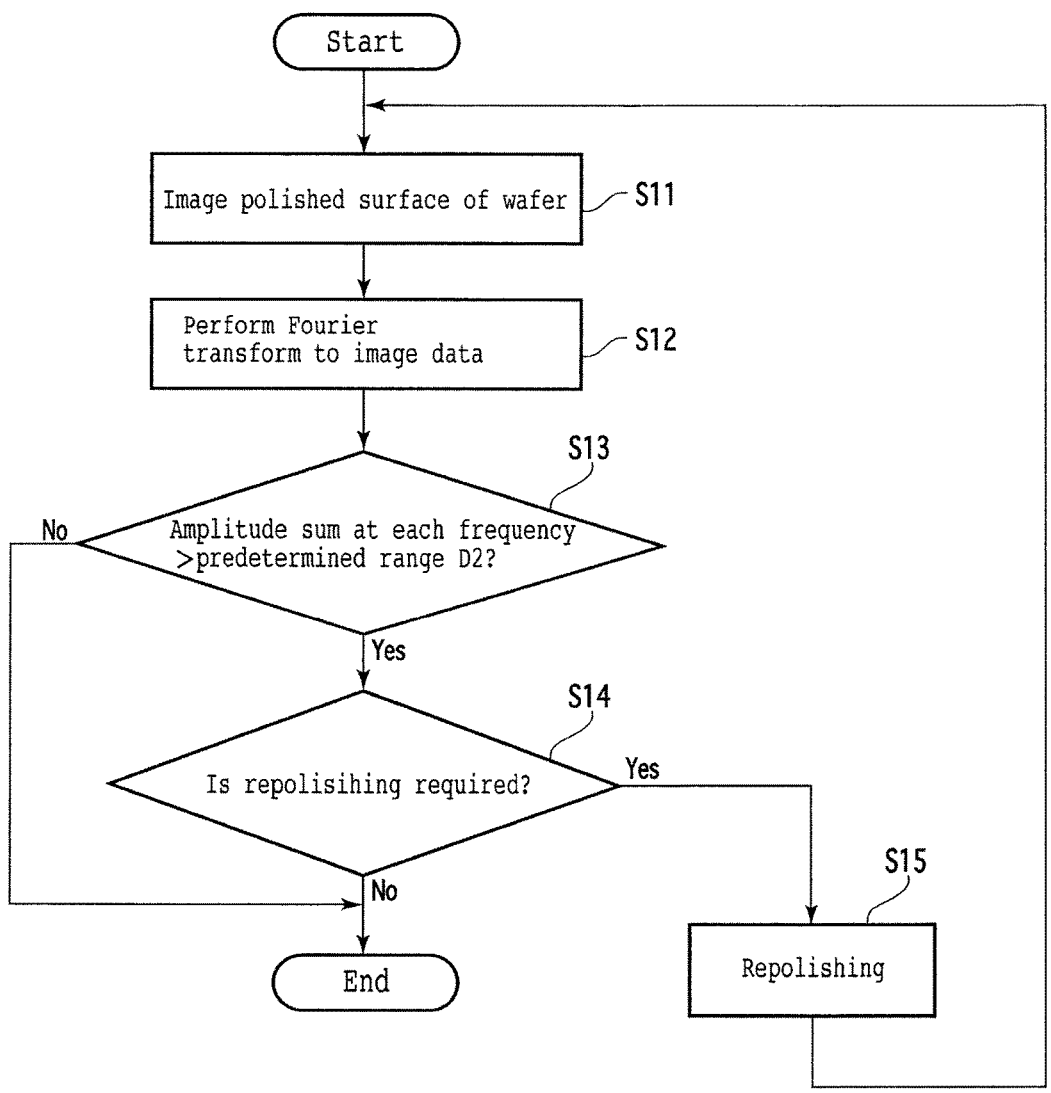

WAFER INSPECTION METHOD AND GRINDING AND POLISHING APPARATUS

BACKGROUND OF THE INVENTION

Field of the Invention

The present invention relates to a wafer inspection method of inspecting a polished surface of a wafer for saw marks and also relates to a grinding and polishing apparatus for performing the wafer inspection method.

Description of the Related Art

In a grinding and polishing apparatus, a wafer is polished after grinding to thereby remove a grinding damage left on the wafer and accordingly improve a die strength (see Japanese Patent Laid-open No. 2005-153090, for example). The grinding and polishing apparatus described in Japanese Patent Laid-open No. 2005-153090 includes a turn table having a plurality of chuck tables and a series of grinding means and polishing means arranged around the turn table. The turn table is intermittently rotated to sequentially move the wafer held on each chuck table to the grinding means and the polishing means in this order. Accordingly, the grinding operation and the polishing operation can be continuously performed without removing the wafer from each chuck table.

SUMMARY OF THE INVENTION

In the grinding operation, the upper surface of the wafer being rotated is ground by abrasive members of a grinding wheel being rotated, so that arcuate saw marks are formed on the upper surface of the wafer by the abrasive members. In the grinding and polishing apparatus described in Japanese Patent Laid-open No. 2005-153090, the polishing operation is performed after performing the grinding operation so as to remove the saw marks. However, in the case that the saw marks formed on the wafer by grinding are deep, there is a possibility that the saw marks may not be sufficiently removed from the wafer. As a result, the saw marks are still left on the wafer in spite of the performance of the polishing operation, causing imperfect polishing of the wafer.

It is therefore an object of the present invention to provide a wafer inspection method and a grinding and polishing apparatus which can remove the saw marks from the wafer to reduce the imperfect polishing of the wafer.

In accordance with an aspect of the present invention, there is provided a wafer inspection method of imaging a polished surface of a wafer to inspect the result of polishing of the wafer, the wafer inspection method including: a polishing step of polishing an upper surface of the wafer held on a chuck table and ground by means of abrasive members; an imaging step of imaging at least a predetermined area of the polished surface of the wafer about the center of the wafer at 360 degrees to thereby obtain image data; and a determining step of performing Fourier transform to the image data to thereby extract a frequency distribution corresponding to saw marks, next performing inverse Fourier transform to the frequency distribution extracted above to obtain an amplitude of each saw mark, and next determining imperfect polishing of the wafer in the case that the amplitude is greater than a predetermined range.

With this configuration, the polished surface of the wafer is imaged to create the image data including the amplitude (height difference) of each saw mark left on the polished surface of the wafer. The saw marks left on the polished surface of the wafer are cyclically repeated (equally spaced in the circumferential direction of the wafer). The image data is subjected to Fourier transform to extract the frequency distribution corresponding to the saw marks. Thereafter, the frequency distribution corresponding to the saw marks is subjected to inverse Fourier transform, thereby obtaining the amplitude of each saw mark without noise. Thereafter, the amplitude of each saw mark without noise is compared with the predetermined range, so that the imperfect polishing of the wafer can be accurately determined. In the case that the amplitude of each saw mark is greater than the predetermined range, it is determined that the polishing of the wafer is imperfect. In this case, the wafer may be polished again to thereby reduce the imperfect polishing.

In accordance with another aspect of the present invention, there is provided a wafer inspection method of imaging a polished surface of a wafer to inspect the result of polishing of the wafer, the wafer inspection method including: a polishing step of polishing an upper surface of the wafer held on a chuck table and ground by means of abrasive members; an imaging step of imaging at least a predetermined area of the polished surface of the wafer about the center of the wafer at 360 degrees to thereby obtain image data; and a determining step of performing Fourier transform to the image data to create a frequency distribution and next determining imperfect polishing of the wafer in the case that the intensity at a part of frequencies in the frequency distribution is greater than a predetermined threshold.

With this configuration, the polished surface of the wafer is imaged to create the image data including not only the amplitude (height difference) of the saw marks left on the polished surface of the wafer, but also the characteristics of grinding dust and flaws produced in grinding the wafer. The image data is subjected to Fourier transform to thereby obtain the height difference on the polished surface as the frequency distribution indicating the intensity (amplitude or amplitude sum) at each frequency. The intensity over the frequency distribution can be compared with the predetermined threshold, so that it is possible to determine not only the imperfect polishing due to the saw marks, but also the imperfect polishing including a bad condition of the polished surface of the wafer due to the grinding dust and flaws at any positions other than the saw marks. In the case that the amplitude at a part of the frequencies is larger than the predetermined threshold and it is accordingly determined that the polishing of the wafer is imperfect, the wafer may be polished again to thereby reduce the imperfect polishing.

In accordance with a further aspect of the present invention, there is provided a grinding and polishing apparatus including: a chuck table having a holding surface for holding a lower surface of a wafer; rotating means for rotating the chuck table; grinding means having abrasive members arranged annularly and adapted to abut against an upper surface of the wafer held on the chuck table, thereby grinding the upper surface of the wafer; polishing means for polishing the upper surface of the wafer ground by the grinding means; and a wafer inspection mechanism inspecting a polished surface of the wafer as the upper surface of the wafer polished by the polishing means; the wafer inspection mechanism including: an imaging camera imaging the polished surface of the wafer from the upper side thereof to obtain image data; a light source horizontally applying light to a predetermined area of the polished surface of the wafer to be imaged by the imaging camera; and determining means for determining imperfect polishing of the wafer from the image data.

Preferably, when the imperfect polishing is determined by the determining means of the wafer inspection mechanism, the upper surface of the wafer is polished again by the polishing means.

According to the present invention, the polished surface of the wafer can be accurately inspected for the saw marks. In the case that the polishing of the wafer is imperfect, the wafer is polished again to thereby remove the saw marks from the polished surface of the wafer and accordingly reduce the imperfect polishing of the wafer.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 6 is a flowchart showing the second wafer inspection method.

DETAILED DESCRIPTION OF THE PREFERRED EMBODIMENT

Figure 1:
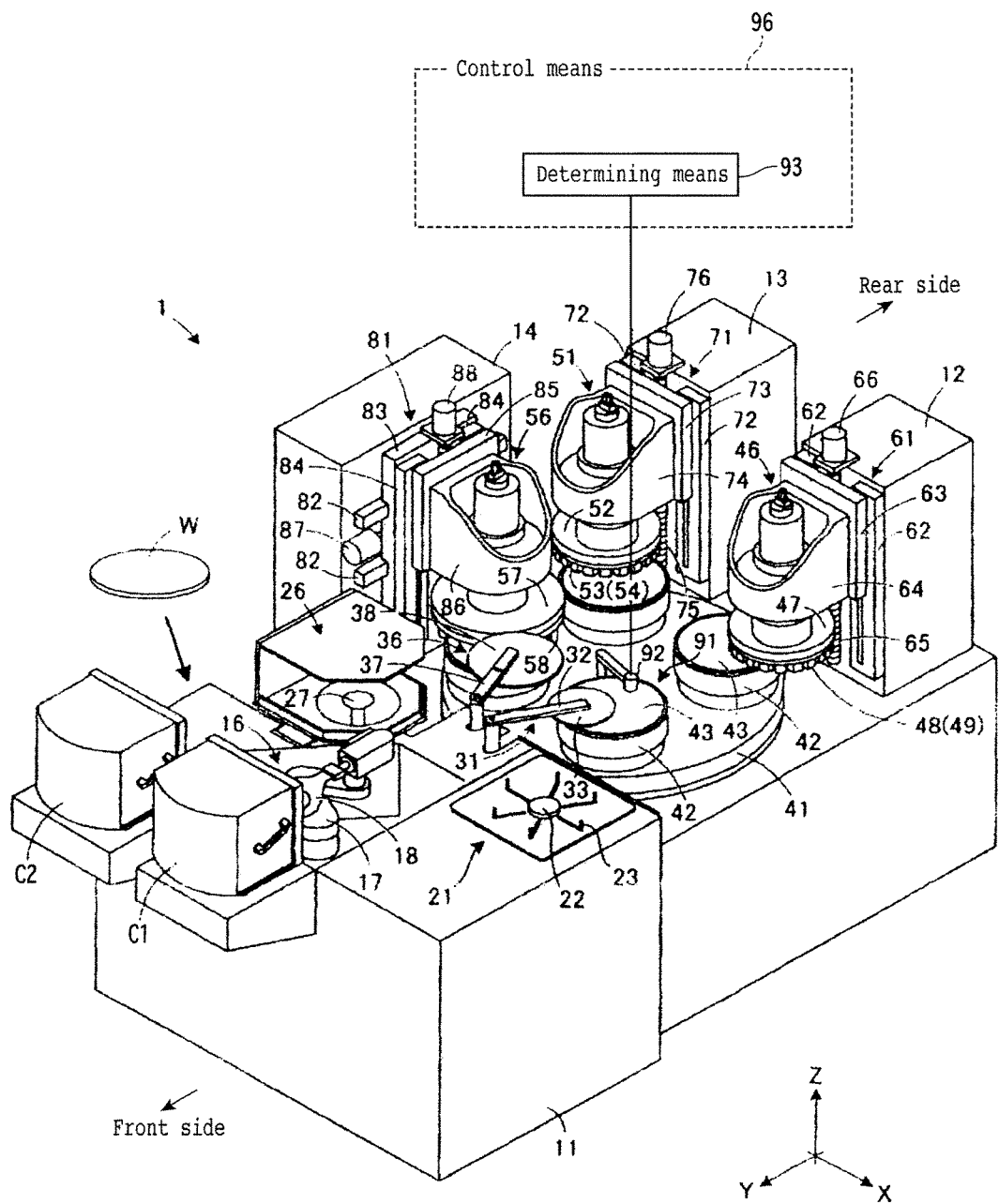
FIG. 1 is a perspective view of a grinding and polishing apparatus according to a preferred embodiment of the present invention.

A grinding and polishing apparatus according to a preferred embodiment of the present invention will now be described with reference to the attached drawings. FIG. 1 is a perspective view of the grinding and polishing apparatus according to this preferred embodiment. The configuration of the grinding and polishing apparatus shown in FIG. 1 is merely illustrative. The grinding and polishing apparatus according to the present invention may have any configuration capable of grinding and polishing a wafer.

Reference numeral 1 shown in FIG. 1 generally denotes the grinding and polishing apparatus according to this preferred embodiment. The grinding and polishing apparatus 1 is a full automatic processing apparatus capable of full-automatically performing a series of operations including loading, rough grinding, finish grinding, polishing, cleaning, and unloading for a wafer W. The wafer W is a substantially disk-shaped workpiece and it is stored in a cassette C1 carried to the grinding and polishing apparatus 1. The wafer W may be any platelike workpiece to be ground and polished. For example, the wafer W may be a semiconductor substrate formed of silicon, gallium arsenide, etc., an inorganic substrate formed of ceramic, glass, sapphire, etc., or a package substrate for a semiconductor product.

The grinding and polishing apparatus 1 includes a base 11. A pair of cassettes C1 and C2 are placed at the front end of the base 11. A plurality of wafers W to be processed by the apparatus 1 are stored in the cassette C1, and a plurality of wafers W already processed by the apparatus 1 are stored in the cassette C2. A cassette robot 16 is provided on the rear side of the cassettes C1 and C2. The cassette robot 16 functions to take any one of the wafers W out of the cassette C1 before processing and also functions to take the wafer W into the cassette C2 after processing. A positioning mechanism 21 for positioning the wafer W before processing is provided on the right rear side of the cassette robot 16. A cleaning mechanism 26 for cleaning the wafer W after processing is provided on the left rear side of the cassette robot 16. Loading means 31 for loading the wafer W to a chuck table 42 before processing is provided between the positioning mechanism 21 and the cleaning mechanism 26. Unloading means 36 for unloading the wafer W from the chuck table 42 after processing is provided adjacent to the loading mechanism 31 between the positioning mechanism 21 and the cleaning mechanism 26.

The cassette robot 16 includes a robot arm 17 configured by an articulated link and a hand portion 18 provided at the front end of the robot arm 17. The wafer W to be processed is transferred from the cassette C1 to the positioning mechanism 21 by the cassette robot 16. Further, the wafer W already processed is transferred from the cleaning mechanism 26 to the cassette C2 by the cassette robot 16. The positioning mechanism 21 includes a temporary setting table 22 for temporarily setting the wafer W and a plurality of positioning pins 23 arranged around the temporary setting table 22 so as to be movable toward and away from the center of the temporary setting table 22. The wafer W placed on the temporary setting table 22 is positioned in such a manner that the plural positioning pins 23 are moved to abut against the outer circumference of the wafer W, thereby making the center of the wafer W into coincidence with the center of the temporary setting table 22.

The loading means 31 includes a loading arm 32 horizontally swingable above the base 11 and a loading pad 33 provided at the front end of the loading arm 32. The wafer W is loaded by the loading means 31 in such a manner that the wafer W is lifted from the temporary setting table 22 by the loading pad 33 and then moved to the chuck table 42 by swinging the loading arm 32. Similarly, the unloading means 36 includes an unloading arm 37 horizontally swingable above the base 11 and an unloading pad 38 provided at the front end of the unloading arm 37. The wafer W is unloaded by the unloading means 36 in such a manner that the wafer W is lifted from the chuck table 42 by the unloading pad 38 and then moved to the cleaning mechanism 26 by swinging the unloading arm 37.

The cleaning mechanism 26 includes a spinner table 27 for holding the wafer W and various nozzles (not shown) for discharging a cleaning water and a drying air toward the wafer W held on the spinner table 27. In the cleaning mechanism 26, the spinner table 27 holding the wafer W is lowered to the inside of the base 11 and the cleaning water is discharged from the nozzle to the wafer W to clean the wafer W as spinning the spinner table 27. Thereafter, the drying air is blown against the wafer W to dry the wafer W. A turn table 41 is provided on the rear side of the loading means 31 and the unloading means 36. Four chuck tables 42 are provided on the turn table 41 so as to be equally spaced from each other in the circumferential direction of the turn table 41. Each chuck table 42 has an upper surface as a holding surface 43 for holding the lower surface of the wafer W. Each chuck table 42 is rotatable about its center by rotating means (not shown) provided in the base 11.

The turn table 41 is adapted to be rotated intermittently at 90° intervals, thereby sequentially positioning the wafer W at a load/unload position where the wafer W is loaded or unloaded, a rough grinding position where the wafer W is opposed to rough grinding means 46, a finish grinding position where the wafer W is opposed to finish grinding means 51, and a polishing position where the wafer W is opposed to polishing means 56. At the rough grinding position, the wafer W is rough-ground by the rough grinding means 46 to reduce the thickness of the wafer W to a predetermined thickness. At the finish grinding position, the wafer W is finish-ground by the finish grinding means 51 to reduce the thickness of the wafer W to a finished thickness. At the polishing position, the wafer W is polished by the polishing means 56. Three columns 12, 13, and 14 are provided around the turn table 41.

Moving means 61 for vertically moving the rough grinding means 46 is provided on the column 12. The moving means 61 has a pair of parallel guide rails 62 provided on the front surface of the column 12 so as to extend in the Z direction and a motor-driven Z table 63 slidably mounted on the guide rails 62. The rough grinding means 46 is supported through a housing 64 to the front surface of the Z table 63. A ball screw 65 is threadedly engaged with a nut portion (not shown) formed on the rear surface of the Z table 63. A drive motor 66 is connected to one end of the ball screw 65. When the ball screw 65 is rotationally driven by the drive motor 66, the rough grinding means 46 is moved in the Z direction along the guide rails 62.

Similarly, moving means 71 for vertically moving the finish grinding means 51 is provided on the column 13. The moving means 71 has a pair of parallel guide rails 72 provided on the front surface of the column 13 so as to extend in the Z direction and a motor-driven Z table 73 slidably mounted on the guide rails 72. The finish grinding means 51 is supported through a housing 74 to the front surface of the Z table 73. A ball screw 75 is threadedly engaged with a nut portion (not shown) formed on the rear surface of the Z table 73. A drive motor 76 is connected to one end of the ball screw 75. When the ball screw 75 is rotationally driven by the drive motor 76, the finish grinding means 51 is moved in the Z direction along the guide rails 72.

The rough grinding means 46 has a cylindrical spindle and a mount 47 fixed to the lower end of this spindle. A grinding wheel 49 is mounted on the lower surface of the mount 47 of the rough grinding means 46. The grinding wheel 49 has a plurality of rough grinding abrasive members 48 arranged annularly. For example, each abrasive member 48 is a diamond abrasive member formed by bonding diamond abrasive grains with a bond such as metal bond and resin bond. Similarly, the finish grinding means 51 has a cylindrical spindle and a mount 52 fixed to the lower end of this spindle. A grinding wheel 54 is mounted on the lower surface of the mount 52 of the finish grinding means 51. The grinding wheel 54 has a plurality of finish grinding abrasive members 53 arranged annularly. Each abrasive member 53 is formed by bonding abrasive grains having a grain size smaller than that of the abrasive grains forming each abrasive member 48. In the rough grinding operation, the thickness of the wafer W is reduced to a predetermined thickness. In the finish grinding operation, the thickness of the wafer W is further reduced to a finished thickness.

Moving means 81 for moving the polishing means 56 to a predetermined polishing position with respect to the wafer W is provided on the column 14. The moving means 81 has a pair of parallel guide rails 82 provided on the front surface of the column 14 so as to extend in the Y direction and a motor-driven Y table 83 slidably mounted on the guide rails 82. The moving means 81 further has a pair of parallel guide rails 84 provided on the front surface of the Y table 83 so as to extend in the Z direction and a motor-driven Z table 85 slidably mounted on the guide rails 84. The polishing means 56 is supported through a housing 86 to the front surface of the Z table 85.

A Y ball screw (not shown) is threadedly engaged with a nut portion (not shown) formed on the rear surface of the Y table 83. A drive motor 87 is connected to one end of the Y ball screw. When the Y ball screw is rotationally driven by the drive motor 87, the polishing means 56 is moved in the Y direction along the guide rails 82. Further, a Z ball screw (not shown) is threadedly engaged with a nut portion (not shown) formed on the rear surface of the Z table 85. A drive motor 88 is connected to one end of the Z ball screw. When the Z ball screw is rotationally driven by the drive motor 88, the polishing means 56 is moved in the Z direction along the guide rails 84. The polishing means 56 has a cylindrical spindle and a mount 57 fixed to the lower end of this spindle. A polishing pad 58 is mounted on the lower surface of the mount 57 of the polishing means 56. The polishing pad 58 is formed of a foamed material, fibrous material, etc. In the polishing operation, the upper surface of the wafer W is slightly polished to thereby remove a grinding damage left on the wafer W in the rough grinding operation and the finish grinding operation.

The upper surface of the wafer W processed by the rough grinding and the finish grinding has arcuate saw marks 99 (see FIG. 2C) as the grinding damage. Although the upper surface of the wafer W is polished after performing the finish grinding, there is a case that the saw marks 99 having a large height difference cannot be completely removed. To cope with this problem, a wafer inspection mechanism 91 for inspecting the polished surface of the wafer W is provided near the load/unload position to detect imperfect polishing of the wafer W. If it is determined that the polishing of the wafer W is imperfect, the wafer W is polished again to completely remove the saw marks 99 from the polished surface of the wafer W.

The wafer inspection mechanism 91 includes a light source (not shown) for horizontally applying light to a predetermined area of the polished surface of the wafer W and an imaging camera 92 for imaging the polished surface of the wafer W held on the chuck table 42 from the upper side of the wafer W. Thus, the light from the light source is horizontally applied to the polished surface of the wafer W, so that the saw marks 99 (see FIG. 2C) are three-dimensionally imaged by the imaging camera 92 to thereby form a clear detected image of the saw marks 99 left on the wafer W. The wafer inspection mechanism 91 further includes determining means 93 for determining imperfect polishing of the wafer W from image data obtained from the detected image. The determination processing by the determining means 93 will be hereinafter described in detail.

Control means 96 for centrically controlling all of the components of the grinding and polishing apparatus 1 is provided in the base 11. That is, the control means 96 functions to perform various controls for a rough grinding step by the rough grinding means 46, a finish grinding step by the finish grinding means 51, a polishing step by the polishing means 56, and a determining step (first determining step or second determining step) for imperfect polishing by the determining means 93. The control means 96 is configured by a processor for executing various processing, a memory, etc. The memory is configured by one or more storage media according to uses, such as ROM (Read Only Memory) and RAM (Random Access Memory).

In this grinding and polishing apparatus 1, the wafer W to be processed is transferred from the cassette C1 to the positioning mechanism 21 and then centered by the positioning mechanism 21. Thereafter, the wafer W is loaded to the chuck table 42 set at the load/unload position. Thereafter, the turn table 41 is rotated stepwise to sequentially move the wafer W to the rough grinding position, the finish grinding position, and the polishing position in this order. The wafer W is rough-ground at the rough grinding position, next finish-ground at the finish grinding position, and next polished at the polishing position. Thereafter, the polished surface of the wafer W is inspected at the load/unload position by the wafer inspection mechanism 91. Thereafter, the wafer W is cleaned by the cleaning mechanism 26. Thereafter, the wafer W is transferred from the cleaning mechanism 26 to the cassette C2.

A wafer inspection method by the wafer inspection mechanism 91 will now be described. The wafer inspection mechanism 91 can perform a first wafer inspection method of determining the imperfect polishing from the height difference of the polished surface due to the saw marks 99 and can also perform a second wafer inspection method of determining the imperfect polishing from the height difference of the polished surface due to flaws or grinding dust in addition to the saw marks 99.

Figure 2A:
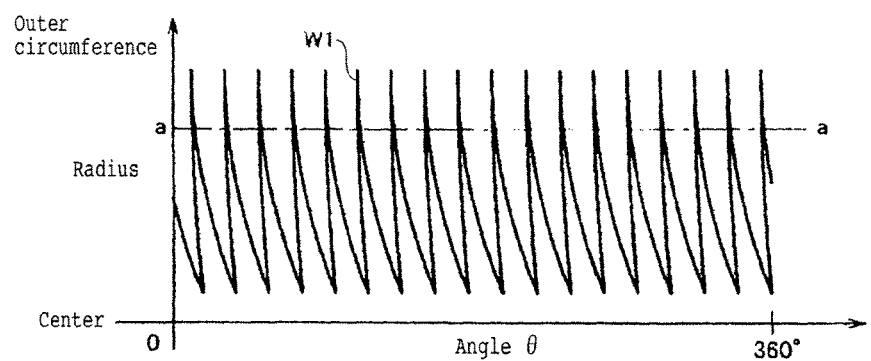
FIGS. 2A to 2C are views showing image data on a polished surface of a wafer according to this preferred embodiment.
Figure 2B:
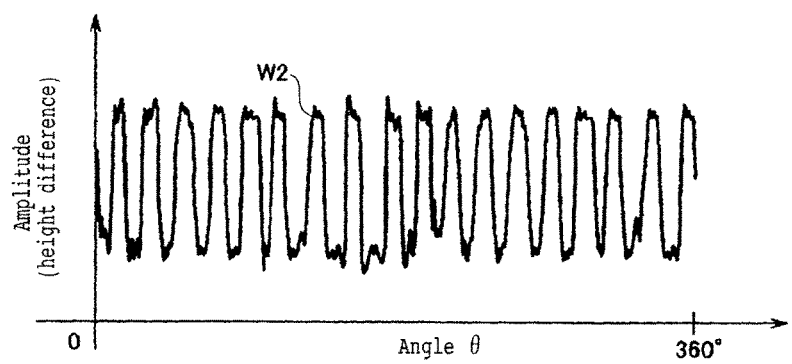
Figure 2C:
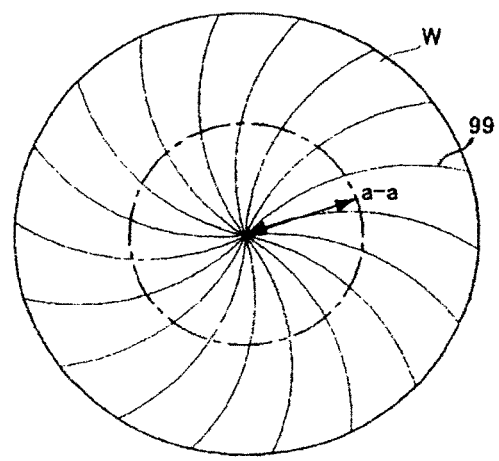
Figure 3A:
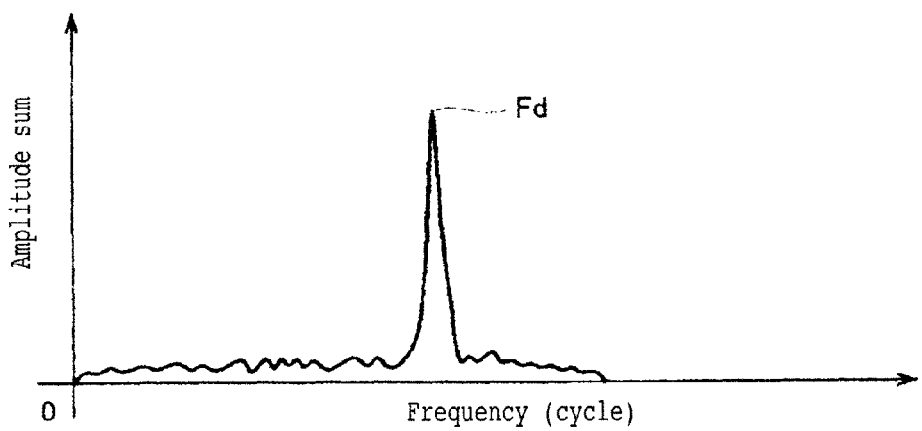
FIGS. 3A and 3B are graphs for illustrating a determining step in a first wafer inspection method according to this preferred embodiment.
Figure 3B:
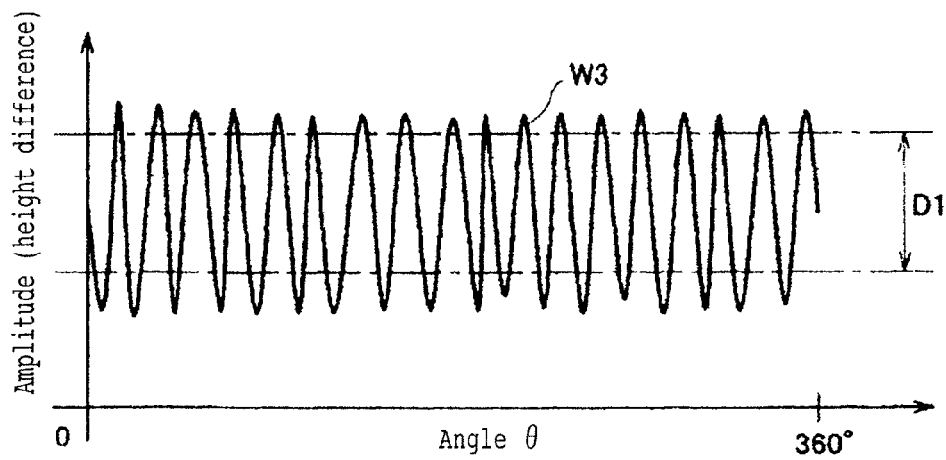

First, a determining step (first determining step) in the first wafer inspection method by the determining means 93 will now be described with reference to FIGS. 2A to 3B. FIGS. 2A to 2C show image data on the polished surface of the wafer W according to this preferred embodiment, and FIGS. 3A and 3B are graphs for illustrating the determining step in the first wafer inspection method according to this preferred embodiment.

The image data shown in FIG. 2A is obtained from the detected image of the polished surface of the wafer W and shows the height difference of the polished surface of the wafer W. In FIG. 2A, the vertical axis represents the radius R of the wafer W, and the horizontal axis represents the angle θ in 360° rotation of the wafer W, wherein the condition of the whole polished surface of the wafer W is shown by Rθ coordinates. The waveform W1 shown by a solid line in FIG. 2A represents an area of the polished surface of the wafer W where the height difference is large. This waveform W1 is formed mainly by the saw marks 99 (see FIG. 2C). Accordingly, the waveform W1 shown in FIG. 2A is represented as cyclic repetition of the saw marks 99 left on the polished surface of the wafer W.

While the height difference of the polished surface of the wafer W is represented by the waveform W1 for convenience of illustration, the height difference is actually represented by a difference in color brightness. That is, the image data shown in FIG. 2A includes a light area and a dark area, wherein the boundary between the light area and the dark area is shown by the waveform W1. Accordingly, the image data shown in FIG. 2A includes information on the height difference in the area where the waveform W1 is not shown. Further, the height difference changes according to the position of the waveform W1. The image data is created by the determining means 93 (see FIG. 1) according to the brightness of each pixel constituting the detected image of the polished surface of the wafer W.

The image data shown in FIG. 2B represents the height difference in an area obtained by cutting the wafer W in the circumferential direction at a radial distance a from the center of the wafer W (see FIG. 2C). In other words, the image data shown in FIG. 2B is obtained by extracting the data at the radial distance a from the image data shown in FIG. 2A. In FIG. 2B, the vertical axis represents the amplitude (height difference of the polished surface of the wafer W) in the cross section taken along the line a-a in FIG. 2A, and the horizontal axis represents the angle θ in 360° rotation of the wafer W. As shown in FIG. 2B, a waveform W2 is cyclically repeated due to the saw marks 99 left on the polished surface of the wafer W and any noise such as grinding dust and flaws.

The saw marks 99 are cyclically formed on the polished surface of the wafer W, and the cycle of the saw marks 99 is determined according to the number of the saw marks 99 in 360° rotation of the wafer W. Accordingly, the cycle of the saw marks 99 decreases with an increase in number of the saw marks 99, so that the number of cycles of the saw marks 99 increases to result in a high frequency. On the other hand, the noise such as grinding dust and flaws is not cyclically repeated on the polished surface of the wafer W. Thus, the waveform W2 includes both the saw marks 99 as a specific cyclic component, i.e., a specific frequency component and the noise as other frequency components.

Thereafter, the image data is subjected to Fourier transform to obtain separate frequency components for analysis as shown in FIG. 3A. Accordingly, the waveform W2 is separated into a frequency distribution Fd corresponding to the saw marks 99 and other frequency distribution corresponding to the noise such as grinding dust and flaws. In FIG. 3A, the vertical axis represents the sum of amplitudes at each frequency (this sum will be hereinafter referred to as amplitude sum). The height difference of the polished surface of the wafer W is large at the position where the saw marks 99 are present, so that the amplitude sum is large at the frequency distribution Fd corresponding to the saw marks 99. Thereafter, the data obtained by the Fourier transform is filtered to extract the frequency distribution Fd corresponding to the saw marks 99. In this case, a frequency band where the saw marks 99 appear can be predicted according to the grinding conditions in the grinding operation, so that the data is filtered in this frequency band to extract the frequency distribution Fd corresponding to the saw marks 99.

The amplitude sum at the frequency distribution Fd corresponding to the saw marks 99 is equal to the sum of amplitudes (height differences) of the individual saw marks 99, so that the amplitude sum increases with an increase in number of the saw marks 99. Accordingly, there is a case that even when the amplitude (height difference) of each saw mark 99 is small, the amplitude sum increases with an increase in frequency. That is, it is difficult to accurately determine imperfect polishing from only the amplitude sum. To cope with this problem, the first wafer inspection method includes the step of performing inverse Fourier transform to the frequency distribution Fd corresponding to the saw marks 99, thereby inspecting the amplitude of each saw mark 99.

As shown in FIG. 3B, the frequency distribution Fd corresponding to the saw marks 99 is subjected to inverse Fourier transform to create a waveform W3 without any noise. At this time, the amplitude sum is separated into the amplitudes of the individual saw marks 99. The amplitude of the waveform W3 shows the height difference of each saw mark 99. The imperfect polishing is determined according to whether or not the height difference of each saw mark 99 is greater than a predetermined range D1 over the circumference of the wafer W. In the case that the height difference of each saw mark 99 is greater than the predetermined range D1 as shown in FIG. 3B, it is determined that each saw mark 99 has not yet been completely removed in the polishing operation and that the polishing is imperfect. In the case that the height difference of each saw mark 99 is less than or equal to the predetermined range D1, it is determined that each saw mark 99 has been sufficiently removed in the polishing operation and that the polishing is not imperfect.

While the image data shown in FIG. 2B is subjected to frequency analysis for determination of imperfect polishing in this preferred embodiment, the image data shown in FIG. 2A may be subjected to frequency analysis for determination of imperfect polishing. Further, while the vertical axis of the image data after Fourier transform represents the amplitude sum as the sum of amplitudes at each frequency, the vertical axis of the image data after Fourier transform may represent the amplitude at each frequency rather than the amplitude sum.

Figure 4:
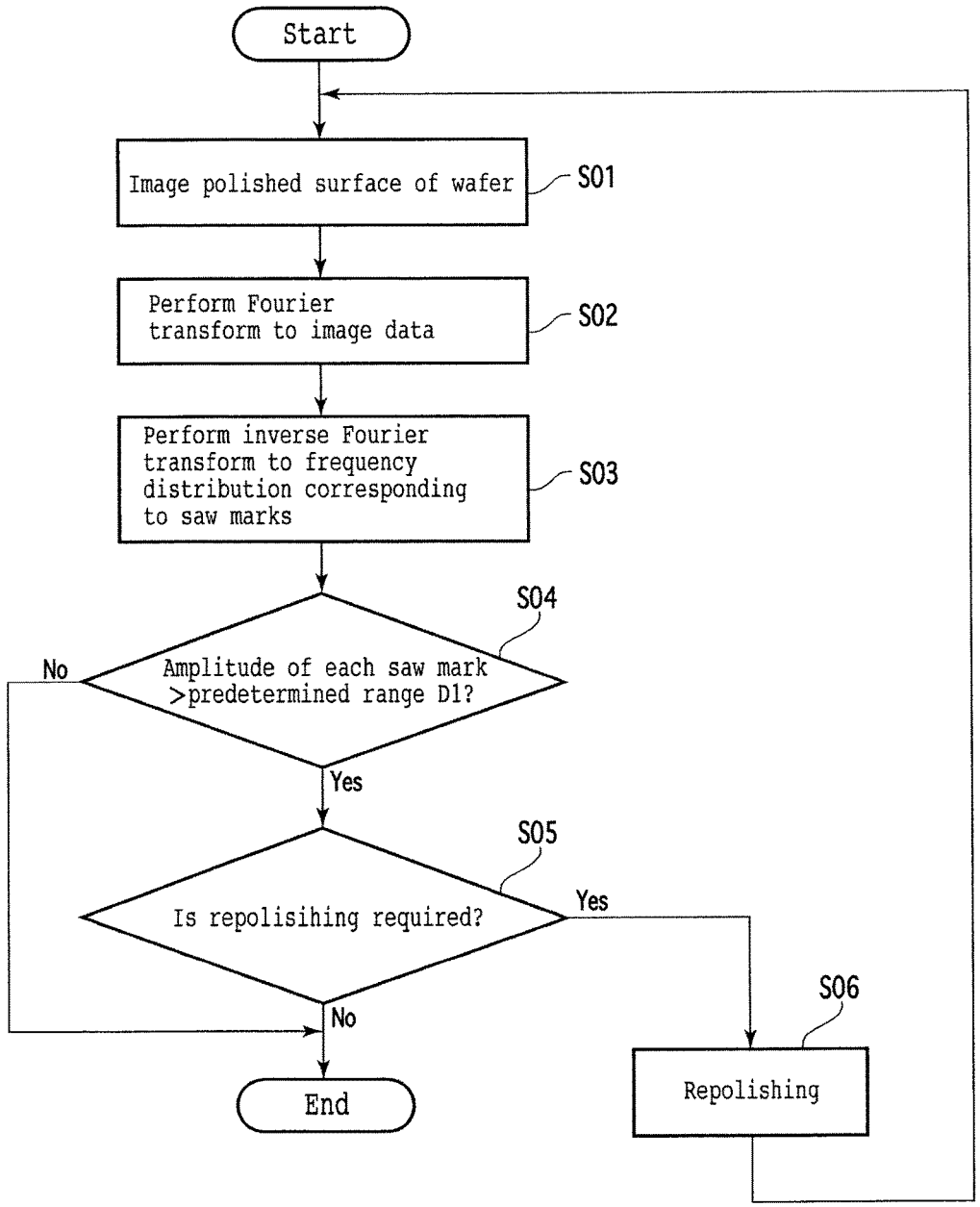
FIG. 4 is a flowchart showing the first wafer inspection method.

The flow of the first wafer inspection method by the wafer inspection mechanism 91 will now be described with reference to FIG. 4. FIG. 4 is a flow chart showing the first wafer inspection method according to this preferred embodiment. In FIG. 4, the wafer has already been subjected to the polishing step, in which the upper surface of the wafer held on the chuck table has been ground by the abrasive members and the ground surface of the wafer is polished.

As shown in FIG. 4, an imaging step is performed to image the polished surface of the wafer W (step S01). In the imaging step, the imaging camera 92 (see FIG. 1) is horizontally swung above the wafer W in the radial direction thereof, and at the same time the wafer W is continuously rotated, so that the whole polished surface of the wafer W is spirally imaged. As a modification, a line sensor having a length equal to the radius of the wafer W may be used to perform the imaging step. Also in this case, the wafer W is rotated as operating the line sensor to thereby image the whole polished surface of the wafer W. Further, while the whole polished surface of the wafer W is imaged in this preferred embodiment, a predetermined area of the polished surface of the wafer W about the center of the wafer W at 360° may be imaged.

In the imaging step, image data is created from the detected image of the polished surface of the wafer W. The image data represents a height difference on the polished surface of the wafer W in the R$\theta$ coordinate system where the vertical axis represents the radius R of the wafer W and the horizontal axis represents the angle $\theta$ in 360° rotation of the wafer W (see FIG. 2A). In this case, light is horizontally applied to the polished surface of the wafer W in imaging the polished surface, so that the height difference on the polished surface of the wafer W appears as a difference in brightness in the detected image. The height difference on the polished surface of the wafer W is determined from the brightness of each pixel constituting the detected image, thereby creating the image data. The image data includes not only the saw marks 99, but also noise due to grinding dust and flaws.

Thereafter, the image data is subjected to Fourier transform (step S02). As a result, the image data is separated into a frequency distribution Fd corresponding to the saw marks 99 and a frequency distribution corresponding to the noise (see FIG. 3A). In this case, the image data shown in FIG. 2A may be subjected to Fourier transform or the image data shown in FIG. 2B (which is extracted along the line a-a from the image data shown in FIG. 2A) may be subjected to Fourier transform. Thereafter, the data obtained by Fourier transform is filtered to extract the frequency distribution Fd corresponding to the saw marks 99, and the frequency distribution Fd extracted above is subjected to inverse Fourier transform (step S03). As a result, the noise included in the image data is removed and the amplitude indicative of the height difference of each saw mark 99 is obtained (see FIG. 3B).

Thereafter, it is determined whether or not the amplitude of each saw mark 99 is greater than the predetermined range D1 (e.g., 0.1 μm) (step S04). If the amplitude of each saw mark 99 is less than or equal to the predetermined range D1 (No in step S04), it is determined that the polishing is not imperfect and the inspection of the wafer W is ended. If the amplitude of each saw mark 99 is greater than the predetermined range D1 (Yes in step S04), it is determined that the polishing is imperfect. In this case, it is determined whether or not the polishing step is to be performed again to the wafer W (step S05). In this case, a tolerance of 1 μm is preliminarily set for the thickness of the wafer W polished. Accordingly, repolishing is determined according to whether or not the thickness of the wafer W polished falls within the tolerance.

If the polishing step is not to be performed again to the wafer W (No in step S05), it is determined that the polishing is imperfect and the inspection of the wafer W is ended. If the polishing step is to be performed again to the wafer W (Yes in step S05), the polishing step is performed again to the wafer W so that the amplitude of each saw mark 99 becomes less than or equal to the predetermined range D1 (step S06). In this manner, the frequency distribution Fd corresponding to the saw marks 99 is extracted from the image data and the imperfect polishing of the wafer W is determined according to the height difference of each saw mark 99 in the first wafer inspection method.

In the first wafer inspection method according to this preferred embodiment described above, the image data is subjected to Fourier transform to thereby extract the frequency distribution Fd corresponding to the saw marks 99. The frequency distribution Fd corresponding to the saw marks 99 is next subjected to inverse Fourier transform to thereby obtain the amplitude of each saw mark 99 without noise. The amplitude of each saw mark 99 without noise is next compared with the predetermined range D1. Therefore, the imperfect polishing of the wafer W can be accurately determined. In the case that the amplitude of each saw mark 99 is greater than the predetermined range D1 and it is accordingly determined that the polishing of the wafer W is imperfect, the wafer W is polished again to thereby reduce the imperfect polishing.

Figure 5A:
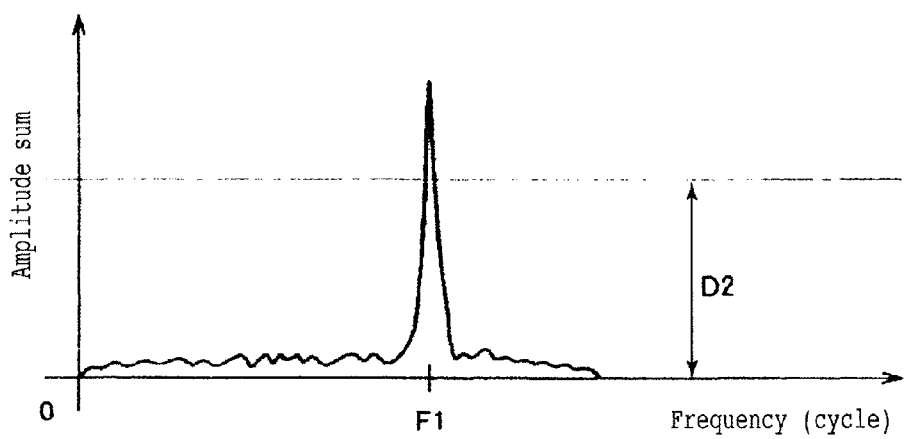
FIGS. 5A and 5B are graphs for illustrating a determining step in a second wafer inspection method according to this preferred embodiment.
Figure 5B:
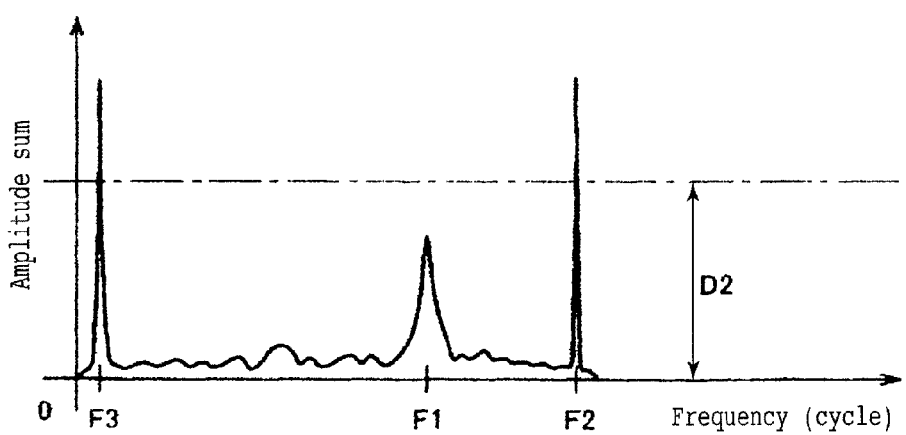

A determining step (second determining step) in the second wafer inspection method by the determining means 93 will now be described with reference to FIGS. 5A and 5B. FIGS. 5A and 5B are graphs for illustrating the determining step in the second wafer inspection method according to this preferred embodiment. The determining step in the second wafer inspection method is different from the determining step in the first wafer inspection method in the point that the imperfect polishing is determined from the amplitude sum of the image data obtained by Fourier transform. In the second wafer inspection method, the image data similar to that used in the first wafer inspection method is used.

As shown in FIGS. 5A and 5B, the image data (see FIG. 2A or 2B) is subjected to Fourier transform to obtain separate frequency components for analysis. Accordingly, the amplitude sum as the sum of amplitudes at each frequency component can be obtained. In the case that a large amount of grinding dust or flaws is present on the whole polished surface of the wafer W, there is a possibility that a large amplitude sum may be detected not only at the frequency corresponding to the saw marks 99 (see FIG. 2C), but also at any other frequencies. In such a case, it is assumed that even when the height difference of the saw marks 99 left on the polished surface of the wafer W is not large, the condition of the polished surface of the wafer W is abnormal due to the grinding dust or flaws.

In the second wafer inspection method, the image data is subjected to Fourier transform to create a frequency distribution, and the imperfect polishing is determined according to whether or not the amplitude sum (intensity) at at least a part of the frequency distribution is greater than a predetermined amplitude sum (threshold) D2. The predetermined amplitude sum D2 is set as a criterion of determination for the amplitude sum of the saw marks 99 and also as a criterion of determination for the amplitude sum of the grinding dust and flaws. Thus, not only the height difference on the polished surface of the wafer W due to the saw marks 99, but also the height difference on the polished surface of the wafer W due to the grinding dust and flaws is inspected. Accordingly, regardless of the position of the frequency distribution obtained by Fourier transform of the image data, the imperfect polishing is determined in the case that the amplitude sum at a part of the frequencies is greater than the predetermined amplitude sum D2.

For example, in the case of FIG. 5A where the amplitude sum at a frequency F1 corresponding to the saw marks 99 is greater than the predetermined amplitude sum D2, it is determined that the height difference on the polished surface of the wafer W due to the saw marks 99 is large, so that the imperfect polishing is determined. In the case of FIG. 5B where the amplitude sum at each of the frequencies F2 and F3 other than the frequency F1 corresponding to the saw marks 99 is greater than the predetermined amplitude sum D2, it is determined that the height difference on the polished surface of the wafer W is large due to a large amount of grinding dust or any other dust present on the polished surface of the wafer W (F2) or due to large-sized grinding dust or deep flaws present on the polished surface of the wafer W (F3), so that the imperfect polishing is determined. In the case that the amplitude sum at each frequency in the frequency distribution is less than or equal to the predetermined amplitude sum D2, it is determined that the polishing is not imperfect.

The image data shown in FIG. 2A may be subjected to frequency analysis for determination of imperfect polishing or the image data shown in FIG. 2B may be subjected to frequency analysis for determination of imperfect polishing. Further, while the vertical axis of the image data after Fourier transform represents the amplitude sum as the sum of amplitudes at each frequency as shown in FIGS. 5A and 5B, the vertical axis of the image data after Fourier transform may represent the amplitude at each frequency rather than the amplitude sum.

The flow of the second wafer inspection method by the wafer inspection mechanism 91 will now be described with reference to FIG. 6. FIG. 6 is a flowchart showing the second wafer inspection method according to this preferred embodiment. In FIG. 6, the wafer has already been subjected to the polishing step, in which the upper surface of the wafer held on the chuck table has been ground by the abrasive members and the ground surface of the wafer is polished. Further, the description of similar parts in comparison with the first wafer inspection method will be omitted as required in the following description.

As shown in FIG. 6, an imaging step is performed to image the polished surface of the wafer W as in the first wafer inspection method (step S11). In the imaging step, the imaging camera 92 (see FIG. 1) is used to image at least a predetermined area of the polished surface of the wafer W about the center of the wafer W at 360°. Further, in the imaging step, image data is created from the detected image of the polished surface of the wafer W.

Thereafter, the image data is subjected to Fourier transform (step S12). As a result, the frequency distribution of the image data is obtained, and the amplitude sum as the sum of amplitudes at each frequency component is obtained. In this case, the image data shown in FIG. 2A may be subjected to Fourier transform or the image data shown in FIG. 2B (which is extracted along the line a-a from the image data shown in FIG. 2A) may be subjected to Fourier transform.

Thereafter, it is determined whether or not the amplitude sum at each frequency in the frequency distribution is greater than the predetermined amplitude sum D2 (step S13). If the amplitude sum at each frequency is less than or equal to the predetermined amplitude sum D2 (No in step S13), it is determined that the polishing is not imperfect and the inspection of the wafer W is ended. If the amplitude sum at a part of frequencies is greater than the predetermined amplitude sum D2 (Yes in step S13), it is determined that the polishing is imperfect. In this case, it is determined whether or not the polishing step is to be performed again to the wafer W (step S14). In this case, a tolerance of 1 µm is preliminarily set for the thickness of the wafer W polished. Accordingly, repolishing is determined according to whether or not the thickness of the wafer W polished falls within the tolerance.

If the polishing step is not to be performed again to the wafer W (No in step S14), it is determined that the polishing is imperfect and the inspection of the wafer W is ended. If the polishing step is to be performed again to the wafer W (Yes in step S14), the polishing step is performed again to the wafer W so that the amplitude sum on the polished surface of the wafer W becomes less than or equal to the predetermined amplitude sum D2 (step S15). In this manner, the image data is subjected to frequency analysis and the imperfect polishing of the wafer W is determined according to the height difference on the polished surface of the wafer W due to the grinding dust and flaws in addition to the saw marks 99 in the second wafer inspection method.

In the second wafer inspection method according to this preferred embodiment described above, the polished surface of the wafer W is imaged to create the image data including not only the amplitude (height difference) of the saw marks 99 left on the polished surface of the wafer W, but also the characteristics of the grinding dust and flaws produced in grinding the wafer W. The image data is subjected to Fourier transform to obtain the height difference on the polished surface as the frequency distribution indicating the intensity (amplitude or amplitude sum) at each frequency. The amplitude sum over the frequency distribution can be compared with the predetermined amplitude sum D2, so that it is possible to determine not only the imperfect polishing due to the saw marks 99, but also the imperfect polishing including a bad condition of the polished surface of the wafer W due to the grinding dust and flaws at any positions other than the saw marks 99. In the case that the amplitude sum at a part of the frequencies is larger than the predetermined amplitude sum D2 and it is accordingly determined that the polishing of the wafer W is imperfect, the wafer W is polished again to thereby reduce the imperfect polishing.

The present invention is not limited to the above preferred embodiment, but various modifications may be made. The size and shape of each part shown in the attached drawings are not limited, but may be suitably changed within the scope where the effect of the present invention is exhibited.

Further, the above preferred embodiment may be suitably changed without departing from the scope of the object of the present invention.

For example, while the grinding and polishing apparatus 1 in the above preferred embodiment is so configured as to perform either the first wafer inspection method or the second wafer inspection method, the grinding and polishing apparatus 1 can selectively perform the first and second wafer inspection methods or can perform suitable combination of the first and second wafer inspection methods. In the latter case, the imperfect polishing is determined according to whether or not the amplitude sum at each frequency of the image data after Fourier transform is greater than the predetermined amplitude sum. Further, the frequency distribution corresponding to the amplitude sum greater than the predetermined amplitude sum is extracted by filtering, and the frequency distribution extracted above is subjected to inverse Fourier transform. Further, the imperfect polishing is determined again according to whether or not the amplitude after inverse Fourier transform is less than or equal to the predetermined range. In this manner, the imperfect polishing may be determined in two steps.

Further, when the imperfect polishing of the wafer W is determined, the wafer W is polished again in the above preferred embodiment. As a modification, when the imperfect polishing is determined, the wafer W may be discarded without performing the repolishing.

As described above, the present invention has the effect that the saw marks on the polished surface of the wafer can be removed to reduce the imperfect polishing. In particular, the present invention is useful as a full automatic type grinding and polishing apparatus capable of full-automatically performing a grinding operation and a polishing operation and also useful as a wafer inspection method to be performed by this grinding and polishing apparatus.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A wafer inspection method of imaging a polished surface of a wafer to inspect the result of polishing of said wafer, said wafer inspection method comprising:
    a polishing step of polishing an upper surface of said wafer held on a chuck table and ground by means of abrasive members;
    an imaging step of imaging at least a predetermined area of said polished surface of said wafer about the center of said wafer at 360 degrees to thereby obtain image data; and
    a determining step of performing Fourier transform to said image data to thereby extract a frequency distribution corresponding to saw marks, next performing inverse Fourier transform to said frequency distribution extracted above to obtain an amplitude of each saw mark, and next determining imperfect polishing of said wafer in the case that said amplitude is greater than a predetermined range.

2. A wafer inspection method of imaging a polished surface of a wafer to inspect the result of polishing of said wafer, said wafer inspection method comprising:
    a polishing step of polishing an upper surface of said wafer held on a chuck table and ground by means of abrasive members;
    an imaging step of imaging at least a predetermined area of said polished surface of said wafer about the center of said wafer at 360 degrees to thereby obtain image data; and
    a determining step of performing Fourier transform to said image data to create a frequency distribution and next determining imperfect polishing of said wafer in the case that the intensity at a part of frequencies in said frequency distribution is greater than a predetermined threshold.

3. A grinding and polishing apparatus comprising:
    a chuck table having a holding surface for holding a lower surface of a wafer;
    rotating means for rotating said chuck table;
    grinding means having abrasive members arranged annularly and adapted to abut against an upper surface of said wafer held on said chuck table, thereby grinding said upper surface of said wafer;
    polishing means for polishing said upper surface of said wafer ground by said grinding means; and
    a wafer inspection mechanism inspecting a polished surface of said wafer as said upper surface of said wafer polished by said polishing means;
    said wafer inspection mechanism including:
        an imaging camera imaging said polished surface of said wafer from the upper side thereof to obtain image data;
        a light source horizontally applying light to a predetermined area of said polished surface of said wafer to be imaged by said imaging camera; and
        determining means for determining imperfect polishing of said wafer from said image data.

4. The grinding and polishing apparatus according to claim 3, wherein when said imperfect polishing is determined by said determining means of said wafer inspection mechanism, said upper surface of said wafer is polished again by said polishing means.

* * * * *